(12) United States Patent
Chiu et al.

(10) Patent No.: US 6,651,736 B2
(45) Date of Patent: Nov. 25, 2003

(54) SHORT CARBON FIBER ENHANCED THERMAL GREASE

(75) Inventors: Chia-Pin Chiu, Tempe, AZ (US);
 James C. Shipley, Gilbert, AZ (US);
 Craig B. Simmons, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 70 days.

(21) Appl. No.: 09/894,259

(22) Filed: Jun. 28, 2001

(65) Prior Publication Data

US 2003/0000690 A1 Jan. 2, 2003

(51) Int. Cl.[7] .................................................. F28F 7/00
(52) U.S. Cl. ........................ 165/185; 361/708; 257/746; 428/40.5
(58) Field of Search ...................... 165/104.33, 80.3, 165/185; 361/713, 708; 428/40.5, 41.5, 515; 257/746

(56) References Cited

U.S. PATENT DOCUMENTS

| | | | | |
|---|---|---|---|---|
| 4,654,754 A | * | 3/1987 | Daszkowski | 165/185 |
| 5,141,050 A | * | 8/1992 | Schuft | 165/185 |
| 5,198,189 A | * | 3/1993 | Booth et al. | 420/555 |
| 5,224,017 A | * | 6/1993 | Martin | 165/185 |
| 5,268,414 A | * | 12/1993 | Nakai et al. | 524/539 |
| 5,323,294 A | * | 6/1994 | Layton et al. | 361/699 |
| 5,545,473 A | * | 8/1996 | Ameen et al. | 428/283 |
| 5,660,917 A | * | 8/1997 | Fujimori et al. | 428/195 |
| 5,783,862 A | * | 7/1998 | Deeney | 257/714 |
| 5,945,217 A | * | 8/1999 | Hanrahan | 165/104.17 |
| 6,054,198 A | * | 4/2000 | Bunyan et al. | 165/185 |

* cited by examiner

*Primary Examiner*—Terrell Mckinnon
(74) *Attorney, Agent, or Firm*—Schwegman, Lundberg, Woessner & Kluth, P.A.

(57) ABSTRACT

A thermal conducting material with higher thermal conductivity for a given low viscosity is shown. Carbon fibers are added to the thermal grease to promote thermal conductivity. The carbon fibers are also not highly electrically conductive, reducing the danger of short circuiting due to misapplication of the thermal grease. Due to the high thermal conductivity of the carbon fibers, a lower loading percentage is needed to obtain significant gains in thermal conductivity. The low loading percentages in turn permit lower thermal grease viscosity, which allows the thermal grease to be spread very thin during application.

13 Claims, 5 Drawing Sheets

| FIBER LOADING | OVERALL BULK THERMAL CONDUCTIVITY [W/m-K] | ENHANCEMENT | CONTACT RESISTANCE [deg.C-cm²/W] |
|---|---|---|---|
| 0% | 3.04 | 0.0% | 0.17 |
| 10% | 3.38 | 11.2% | ~0 |
| 15% | 4.06 | 33.4% | ~0 |

Fig. 6

SHORT CARBON FIBER ENHANCED THERMAL GREASE

TECHNICAL FIELD OF THE INVENTION

The present invention relates generally to the field of heat transfer and, in particular, the present invention relates to thermal management of electronic devices.

BACKGROUND

In one embodiment, the present invention is used to transfer heat generated by electronic devices or groups of devices, such as transistors, as are commonly included on integrated circuit (IC) chips. A brief discussion of some electronic systems using IC's, such as personal computers or lower level computer components, is included below to show some possible areas of application for the present invention.

IC's are typically assembled into packages by physically and electrically coupling them to a substrate made of organic or ceramic material. One or more IC packages can be physically and electrically coupled to a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding forming electronic devices such as transistors in IC's, where each new generation of IC must provide increased performance, particularly in terms of an increased number of devices and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments.

An IC is fabricated on a semiconductor substrate that may comprise a number of metal layers selectively patterned to provide metal interconnect lines (referred to herein as "traces"), and one or more electronic devices attached in or on one or more surfaces of the semiconductor substrate. The electronic device or devices are functionally connected to other elements of an electronic system through a hierarchy of electrically conductive paths that include the substrate traces. The substrate traces typically carry signals that are transmitted between the electronic devices, such as transistors, of the IC. Electronic devices and traces can be configured in an IC to form processors. Some IC's have a relatively large number of input/output (I/O) terminals (also called "lands"), as well as a large number of power and ground terminals or lands.

As the internal circuitry of IC's, such as processors, operates at higher and higher clock frequencies, and as IC's operate at higher and higher power levels, the amount of heat generated by such IC's can increase their operating temperature to unacceptable levels. Thermal management of IC's refers to the ability to keep temperature-sensitive elements in an IC within a prescribed operating temperature. Thermal management has evolved to address the increased temperatures created within such electronic devices as a result of increased processing speed/power of the electronic devices.

FIG. 1 illustrates a cross-sectional representation of a common configuration IC package 30. IC package 30 represents a typical structure that includes an IC die 40 mounted in "flip-chip" orientation with its active side facing downward to couple with lands 52 on the upper surface of a board 50 through solder balls or bumps 42. Board 50 can be a one-layer board or a multi-layer board, and it can include additional lands 54 on its opposite surface for mating with additional packaging structure (not shown).

Die 40 generates its heat from internal structure, including wiring traces, that is located near its active side; however, a significant portion of the heat is dissipated through its back side. Heat that is concentrated within the die is dissipated to a large surface that is in contact with the die in the form of an external heat spreader 60 that is typically formed of metal such as copper or aluminum. To improve the thermal conductivity between the die and the external heat spreader 60, a thermal interface material 70 is often provided between the die and external heat spreader 60. To further dissipate heat from external heat spreader 60, a heat sink 80 optionally having heat fins 82 is often coupled to external heat spreader 60. Heat sink 80 dissipates heat into the ambient environment. The thermal interface material 70 shown in FIG. 1 is intended to be a generic illustration of any thermal interface material. In the following discussion, the thermal interface material 70 and its thickness 72 are used to describe many embodiments of a thermal interface material, including several embodiments of the invention.

Prior thermal interface materials 70 have included an oil matrix containing conducting particles such as metal or aluminum nitride (AlN). The combination of matrix and particles forms a viscous material or grease. Conducting particle shapes can most accurately be described as granular, or spherical in shape.

A smaller IC die 40 with a thinner layer of thermal interface material 70 is required to meet industry size reduction pressures. Thermal interface material 70 is applied to the die and spread to a very thin thickness 72 using hydraulic pressure. This pressure must be high, in order to spread the viscous thermal interface material 70. However, it cannot be so high as to damage the more delicate, reduced size IC die. Higher viscosity thermal interface materials 70 in turn require higher pressure to spread them to a given thickness 72. Therefore, a maximum thermal interface material viscosity for use with a given die at a given thickness 72 can be defined. The viscosity must be low enough to allow the thermal interface material 70 to be spread to the design thickness 72 without using an application pressure that would damage the die.

Currently, to obtain increased thermal conductivity, the loading percentage (calculated as a weight percentage of the particles to the total weight) of conductive particles is merely increased. However, this approach may only be used up to a certain loading percentage. Higher loading percentages increase the viscosity of the existing thermal interface materials 70. At a high enough loading percentage, the matrix becomes excessively thickened by the conductive particles, and the thermal interface material 70 will no longer spread to the desired thickness under acceptable pressures.

Another approach to enhance existing thermal interface materials is to use expensive high thermal conductivity materials such as silver or diamond powder. While this approach increases the thermal conductivity of the thermal interface material 70, it significantly increases the cost.

Thermal conduction of existing thermal interface materials 70 is therefore limited by the thermal properties of existing particle materials, and the acceptable range of loading percentages available under design constraints. What is needed is a low cost thermal conducting material with higher thermal conductivity for a given low viscosity.

BRIEF DESCRIPTION OF THE DRAWINGS

FIG. 6 shows tabular experimental results of the invention.

DETAILED DESCRIPTION

Figure 1:
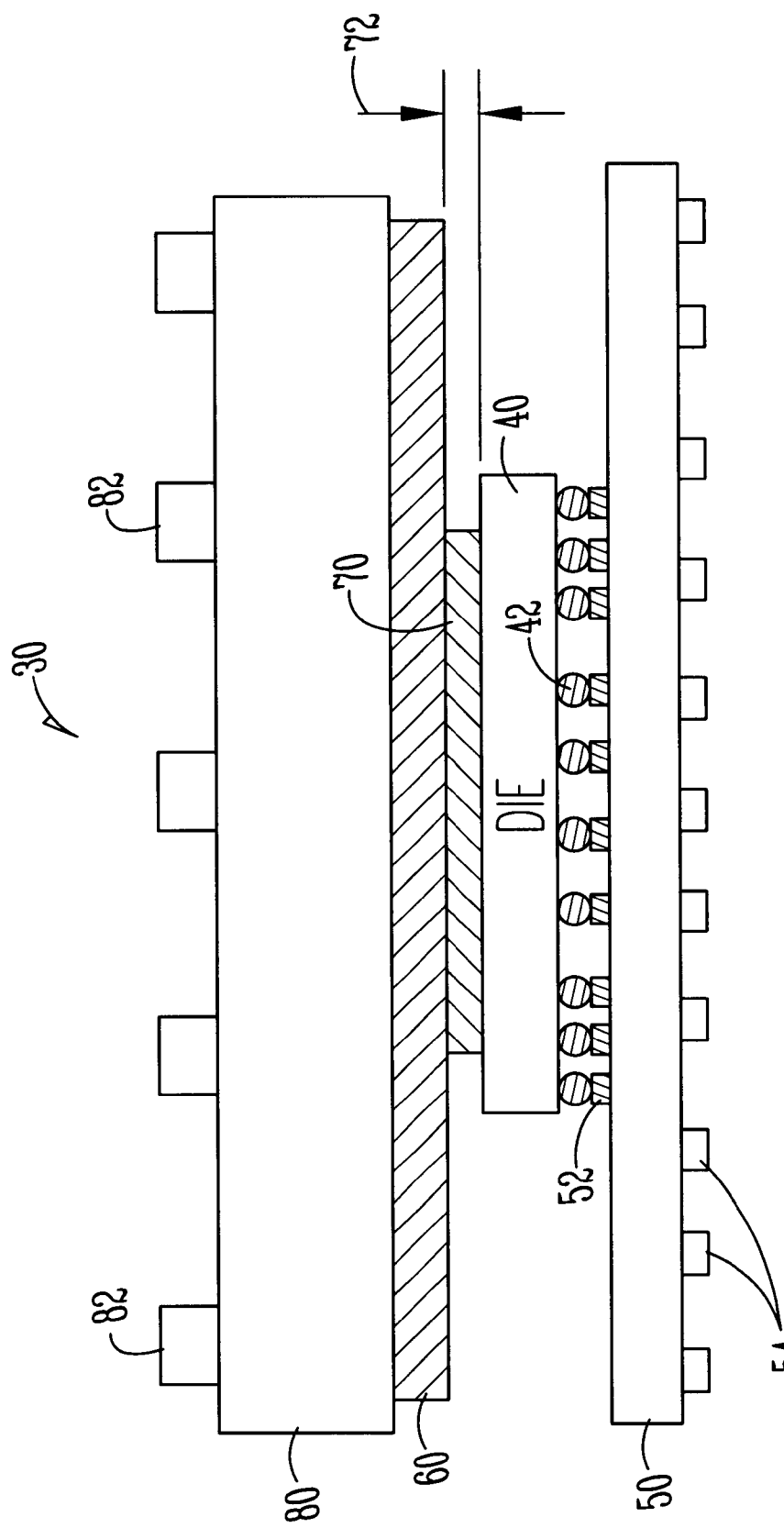
FIG. 1 shows a plan view of an IC package configuration.

In the following detailed description of the invention reference is made to the accompanying drawings which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes may be made, without departing from the scope of the present invention. The following detailed description is, therefore, not to be taken in a limiting sense, and the scope of the present invention is defined only by the appended claims.

The term "active side" as used in this description is defined as the conventional horizontal, large plane or surface of a chip or die where electrical devices have typically been fabricated, regardless of the orientation of the chip or die. The term "back side" as used in this description is defined as a conventional horizontal, large plane or surface of a chip or die that does not contain any active devices on it's surface. The term "vertical" refers to a direction perpendicular to the horizontal as defined above. Prepositions, such as "on", "higher", "lower", "above" and "below" are defined with respect to the conventional plane or surface being on the active side of the chip or die, regardless of the orientation of the chip or die.

The term particle in this application includes generally all shapes of solid objects including random shaped objects, spherical shaped objects, and elongated objects such as fibers. The term fiber in this application refers to a specific shape of particle that contains both a long axis and a short axis. The short axis generally describes an approximate diameter of a fiber cross section, however, the cross section could also includes other geometric shapes such as square. The term viscous in this application refers to a material that will flow at a given temperature when a pressure is exerted upon the material.

Figure 2:
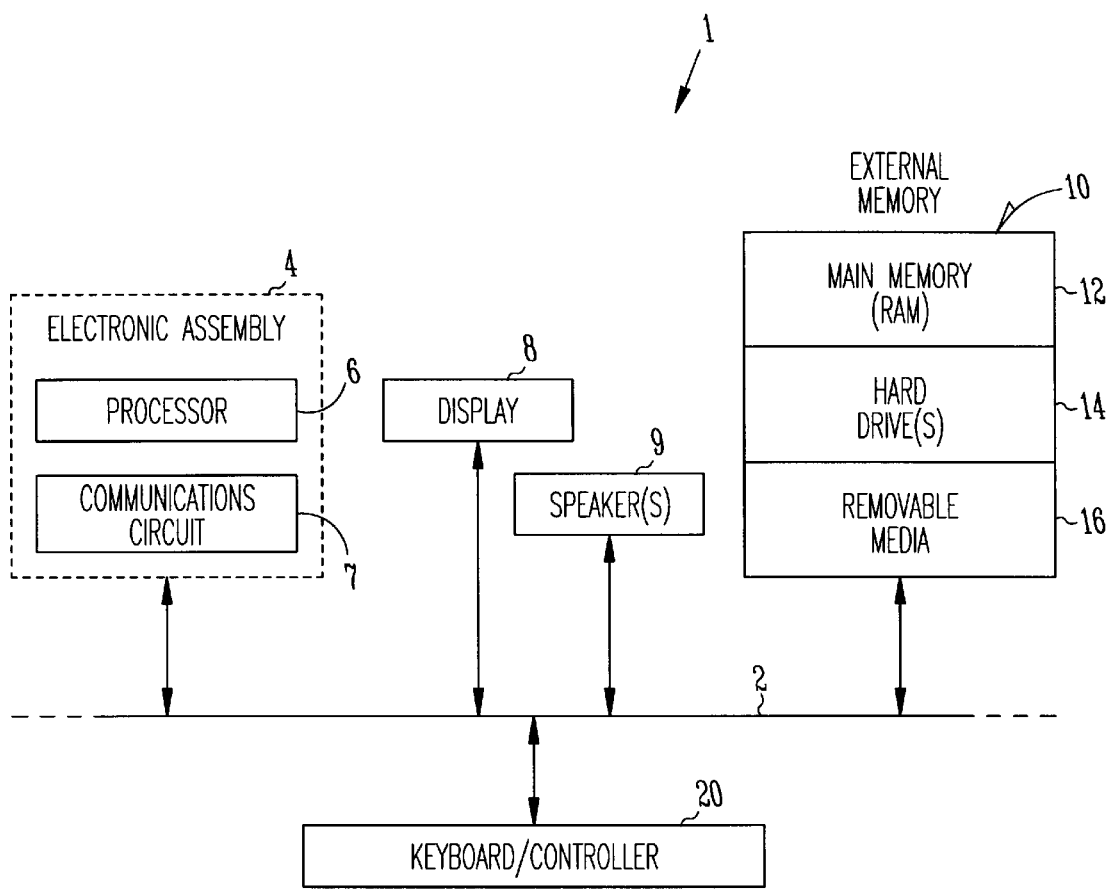
FIG. 2 shows a schematic drawing of an electronic system.

An example of an electronic system using processor chips is included to show an example of a higher level device application for the present invention. FIG. 2 is a block diagram of an electronic system 1 incorporating at least one electronic assembly 4 utilizing a thermal interface material in accordance with one embodiment of the invention. Electronic system 1 is merely one example of an electronic system in which the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDS), digital video disk (DVD), and the like.

Electronic system 1 can also include a display device 8, one or more speakers 9, and a keyboard and/or controller 20, which can include a mouse, trackball, game controller, voice-recognition device, or any other device that permits a system user to input information into and receive information from the electronic system 1.

Although the present invention is found to be effective at transferring heat from IC surfaces, the invention is not limited to heat transfer from IC surfaces. The invention can be used in any setting where heat is to be conducted from one surface to another. For ease of explanation, the example of cooling an IC will be used.

One electronic device factor that affects IC performance is transistor junction temperature $T_j$. Transistor junction temperature is a function of three factors: junction-to-ambient thermal resistance, power dissipation, and ambient temperature. $T_j$ can be expressed by Equation 1:

$$T_j = (\theta_{ja} \times P_d) + T_a \quad \text{(Equation 1)}$$

wherein
  $T_j$=transistor junction temperature (in degrees C.);
  $\theta_{ja}$=the junction-to-ambient thermal resistance (in degrees C./watt);
  $P_d$=power dissipation at $T_j$ (in watts); and
  $T_a$=ambient temperature (in degrees C.).

The junction-to-ambient thermal resistance $\theta_{ja}$ can be represented by Equation 2:

$$\theta_{ja} = \theta_{jc} + \theta_{cs} + \theta_{sa} \quad \text{(Equation 2)}$$

wherein
- $\theta_{jc}$=the junction-to-package case thermal resistance (in degrees C./watt);
- $\theta_{cs}$=the case-to-sink thermal resistance (in degrees C./watt); and
- $\theta_{sa}$=the sink-to-ambient thermal resistance (in degrees C./watt);

In the foregoing definitions, the pertinent location of the case is the top center of the IC package. The pertinent location of the sink can be the geometric center of the heat sink.

Thermal interface materials 70, as shown in FIG. 1, reduce the junction-to-ambient thermal resistance $\theta_{ja}$ by reducing the effective case-to-sink thermal resistance $\theta_{cs}$. As shown in Equation 1, it follows that reductions in $\theta_{ja}$ directly affect IC performance by either lowering the transistor junction temperature $T_j$ to increase IC reliability, or allowing the IC to operate faster under existing transistor junction temperatures $T_j$.

Figure 3:
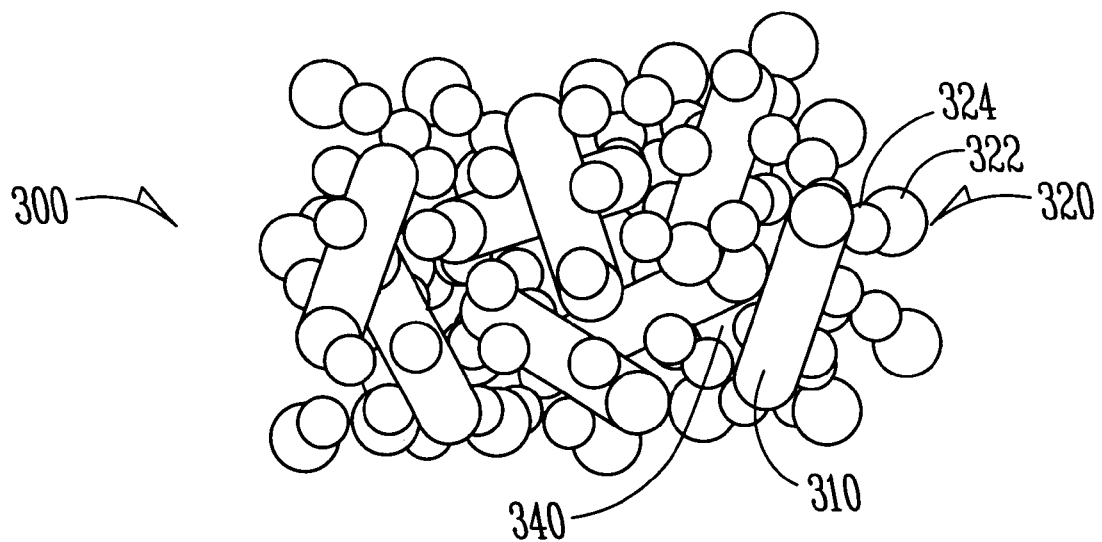
FIG. 3 shows a thermal grease according to the invention.

FIG. 3 shows a thermal grease 300 according to the invention. The thermal grease 300 may be used as a thermal interface material 70 as shown in FIG. 1. Although in FIG. 1, the thermal interface material is shown in direct contact with the die, the thermal interface material 70 could also be used in contact with other surfaces such as a molded package material (not shown). The thermal grease 300 in this embodiment is a composite material including a dispersed phase and a matrix. Included in the dispersed phase is a distribution of particles including a number of carbon fibers 310, and a number of secondary particles 320.

The secondary particles 320 in this embodiment are generally spherical, and include large diameter particles 322 and small diameter particles 324. A distribution of secondary particle size in this embodiment ranges from around 13 μm to 51 μm in diameter. Although in this embodiment, the secondary particle size distribution is as high as about 400%, other embodiments could include wider or narrower size distributions of secondary particles 320.

The secondary particles 320 in this embodiment are comprised of aluminum nitride (AlN), however other materials could be used for the secondary particles 320, such as aluminum oxide ($Al_2O_3$) or boron nitride (BN). Silver or diamond secondary particles 320 could also be used, but as previously mentioned, these particle materials are expensive, and the amount of their use would have to balance their thermal performance against the cost of the particles. This embodiment uses only AlN secondary particles 320, however a mixture of secondary particles 320 using two or more secondary materials could be used. In this embodiment, the secondary particles 320 are predominantly not electrically conductive, while at the same time being effective as thermal conductors. The thermal conducting properties directly enhance the effectiveness of the thermal grease 300, and the lack of electrical conductivity protects electrical devices on the IC from short circuiting due to accidental misapplication of the thermal grease 300.

Some example sources of secondary particles 320 include thermal interface materials 70 such as G749 and G751 from ShinEtsu, and TC-208, TC-I, and TC331 from Thermoset. These sources of secondary particles are sold as traditional thermal interface materials 70 and the secondary particles 320 included in the products indicated above are included in a matrix, as will be discussed below.

Alternative to the non-electrically conductive secondary particles, electrically conductive secondary particles could be used, such as aluminum or copper secondary particles 320. Because high thermal conductivity and electrical conductivity often are present in the same material, this configuration may be used with IC's or other applications where electrical short circuit problems are less of a danger.

Figure 4:
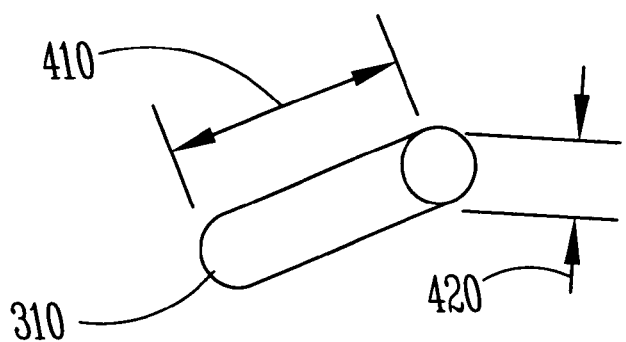
FIG. 4 shows a fiber particle according to the invention.

A single carbon fiber 310 as used in the thermal grease 300 is shown in FIG. 4. The carbon fiber 310 is generally cylindrical in shape, with a diameter 420 and a length 410. In this embodiment the length 410 is approximately 100 μm, while the diameter is approximately 10 μm across. The dimensions of the carbon fibers is dictated by viscosity requirements and the desired final thickness of the thermal grease 300 as illustrated by thickness 72 in FIG. 1. In this embodiment, the dimensions chosen allow the fibers to be randomly oriented at the applied thickness 72, while at the same time, permitting a viscosity of the thermal grease 300 that is low enough to apply to the thickness 72. In this embodiment, the size distribution of the fibers is relatively narrow at around +/−10%, however, other size distributions of carbon fibers 310 could be used. The material composition of the carbon fibers 310 is essentially pure carbon. One form of carbon used is the "high-K carbon fiber K13C2U" manufactured by Mitsubishi Chemical, which has a thermal conduction along the fiber direction of about 674 W/m-K. In one embodiment, the carbon fibers 310 are randomly oriented within the matrix, however higher degrees of ordering the fibers 310 could also be used.

A number of spaces 340 are shown in FIG. 3 that are filled by a matrix material. The matrix in this embodiment includes a silicone based viscous liquid such as an oil or grease. Although silicone oil is used in this embodiment as a matrix to form the thermal grease 300, other matrix materials could be used. An ideal matrix material forms a grease with the carbon fibers 310 and the secondary particles 320 that is highly thermally conductive, without being highly electrically conductive. The resulting thermal grease must also have a viscosity that is in an acceptable range for application to the IC surface, or other surface to be cooled.

Figure 5:
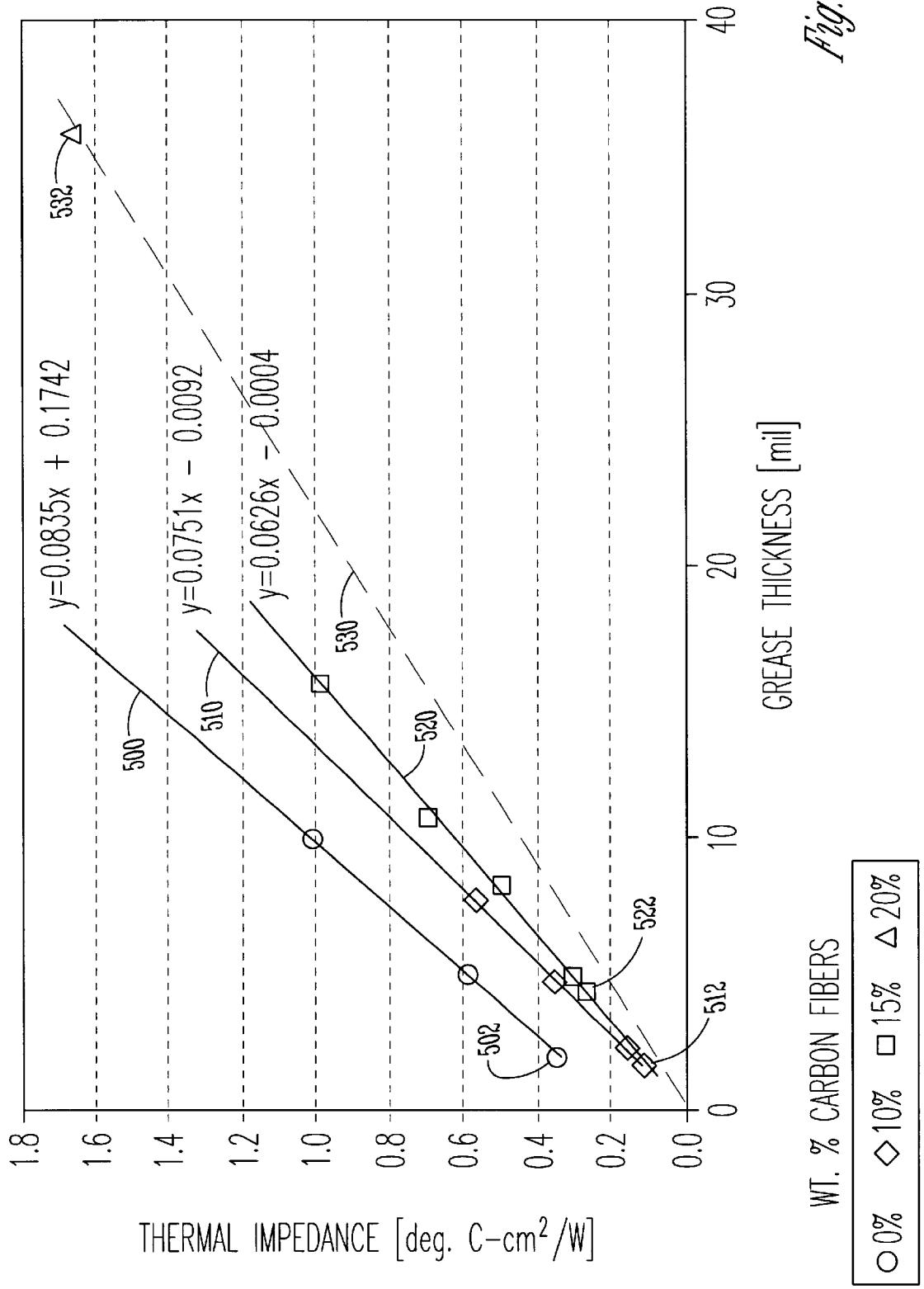
FIG. 5 shows a graph of experimental results of the invention.

In operation, an IC die is first provided. A grease thickness (as illustrated by 72 in FIG. 1) for the thermal grease 300 is chosen based on device designed space constraints and thermal conduction requirements. As shown in FIG. 5, the thermal properties of a thermal interface material such as the thermal grease 300 are related to the grease thickness of the thermal interface material. The thermal grease is mixed to a certain loading percentage of carbon fibers and secondary particles depending on the maximum viscosity allowed. As shown in FIG. 3, the secondary particles 320 in the mixture help to fill the gaps between the carbon fibers 310 and promote thermal conduction from one fiber to another.

Using a 90 psi hydraulic application pressure, each thermal interface material depicted in FIG. 5 may be spread to a minimum grease thickness. Other application pressures can be used, depending on the strength of the IC package used, however, for test purposes a 90 psi application pressure was consistently used as a control variable. Viscosity of the thermal interface materials prohibits them from spreading any thinner than indicated without using more than 90 psi. The current thermal interface material is depicted by line 500, which includes a minimum thickness point 502. A thermal grease containing a 10% loading percentage of carbon fibers along with secondary particles is depicted by line 510, which includes a minimum thickness point 512. A thermal grease containing a 15% loading percentage of carbon fibers along with secondary particles is depicted by line 520, which includes a minimum thickness point 522. A thermal grease containing a 20% loading percentage of carbon fibers along with secondary particles is depicted by line 530, which includes a minimum thickness point 532.

As can be seen from FIG. 5, all of the carbon fiber enhanced thermal greases show significantly less thermal impedance than the current thermal interface material line 500. In addition to exhibiting enhanced thermal conduction, the thermal greases shown in FIG. 5 are also of a low enough viscosity to spread very thin. The 10% loaded thermal grease line 510 shows that this thermal grease can be spread as thin as 2 mils thick (51 $\mu$m) as indicated by minimum thickness point 512. The 15% loaded thermal grease line 520 shows that this thermal grease has a lower thermal impedance than the 10% loaded thermal grease or 0% thermal grease (510 and 500 line respectively). The 15% loaded thermal grease also has a low enough viscosity to be spread as thin as 5 mils thick (127 $\mu$m) as indicated by minimum thickness point 522. When the thermal grease is loaded to 20% carbon fibers as indicated by the dashed line 530, the viscosity is increased, as is the minimum spread thickness. As indicated by minimum thickness point 532, the 20% thermal grease can be spread as thin as approximately 35 mils thick (889 $\mu$m).

FIG. 6 shows summarized thermal properties of a 0% carbon fiber loaded grease (for baseline comparison), a 10% carbon fiber loaded grease and a 15% carbon fiber loaded grease. The 10% carbon fiber loaded thermal grease shows an approximate 11.2% enhancement in bulk thermal conductivity over a thermal grease using only conventional secondary particles. The 15% carbon fiber loaded thermal grease shows an approximate 33.4% enhancement in bulk thermal conductivity over a thermal grease using only conventional secondary particles. It should also be noted that the carbon fiber loaded thermal greases showed little or no contact resistance. The contact resistance is measured by where the extrapolated lines from FIG. 5 cross the "Y" axis.

Conclusion

Thus a low cost thermal conducting material with higher thermal conductivity for a given low viscosity has been shown. The carbon fibers that are added to the thermal grease are inexpensive compared to alternatives such as silver or diamond. The carbon fibers are also not highly electrically conductive, reducing the danger of short circuiting due to misapplication of the thermal grease. Because of the high thermal conductivity of the carbon fibers, a lower loading percentage is needed to obtain significant gains in thermal conductivity. The low loading percentages in turn permit lower thermal grease viscosity, which allows the thermal grease to be spread very thin during application. In contrast, prior methods of increasing thermal conductivity by increasing the loading percentage of secondary particles increases thermal grease viscosity to unacceptable levels. A high viscosity modified thermal grease may not be applied thin enough to accommodate small space design requirements.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

We claim:

1. An information handling system comprising:
   a memory device;
   a processor device;
   a thermal conducting material coupled to the processor device, including:
      a viscous matrix material;
      a distribution of carbon fibers within the viscous matrix material;
   a heat transfer device coupled to the thermal conducting material;
   a system bus coupling the memory device and the processor device; and
   wherein the carbon fibers are approximately 10 $\mu$m in diameter and approximately 100 $\mu$m in length.

2. A thermal conducting material comprising:
   a spreadable matrix material;
   a distribution of carbon fibers within the matrix material; and
   wherein the carbon fibers are approximately 10 $\mu$m in diameter and approximately 100 $\mu$m in length.

3. The thermal conducting material of claim 2, wherein the amount of the distribution of carbon fibers in the spreadable matrix material is between about 10%–20% by weight.

4. The thermal conducting material of claim 2, wherein the carbon fibers are randomly oriented in the spreadable matrix material.

5. The thermal conducting material of claim 2, wherein the spreadable matrix material includes a silicone oil based matrix material.

6. The thermal conducting material of claim 2, further including a second distribution of thermally conductive particles within the spreadable matrix material.

7. The thermal conducting material of claim 6, wherein the second distribution of thermally conductive particles includes electrically insulative particles.

8. The thermal conducting material of claim 6, wherein the second distribution of thermally conductive particles includes at least one particle selected from the group consisting of aluminum nitride (AlN), aluminium oxide ($Al_2O_3$), boron nitride (BN), aluminum, and copper.

9. The thermal conducting material of claim 6, wherein the second distribution of thermally conductive particles includes at least one particle selected from the group consisting of silver and diamond.

10. The thermal conducting material of claim 6, wherein the second distribution of thermally conductive particles includes aluminum nitride (AlN) particles.

11. A method of manufacturing a heat transfer contact, comprising:
   mixing a thermal conduction material, including;
      selecting a volume of a viscous matrix material;
      distributing a number of carbon fibers within the viscous matrix material;
   spreading the thermal conduction material onto the surface to create a surface/thermal conduction material interface;
   contacting a heat transfer device to the thermal conduction material to create a heat transfer device/thermal conduction material interface; and
   wherein distributing a number of carbon fibers includes distributing a number of carbon fibers of approximately 10 $\mu$m in diameter and approximately 100 $\mu$m in length.

12. A method of manufacturing a thermal interface material comprising:
   selecting a volume of a viscous matrix material;
   distributing a number of carbon fibers within the viscous matrix material; and
   wherein distributing a number of carbon fibers includes distributing a number of carbon fibers of approximately 10 $\mu$m in diameter and approximately 100 $\mu$m in length.

13. A method of cooling a surface, comprising:
   conducting heat from the surface through a surface/thermal conduction material interface;
   conducting heat through a thermal conduction material, wherein the thermal conduction material includes a viscous matrix material with a distribution of carbon fibers within the viscous matrix material;

conducting heat through a thermal conduction material/heat transfer device interface; and wherein conducting heat through a thermal conduction material includes conducting heat through a viscous matrix material with a distribution of carbon fibers of approximately 10 μm in diameter and approximately 100 μm in length distributed within the viscous matrix material.

* * * * *